(12) United States Patent
Pang

(10) Patent No.: US 11,594,586 B2
(45) Date of Patent: Feb. 28, 2023

(54) ORGANIC LIGHT EMITTING DISPLAY DEVICE AND METHOD FOR REPAIRING ORGANIC LIGHT EMITTING DISPLAY DEVICE

(71) Applicant: LG DISPLAY CO., LTD., Seoul (KR)

(72) Inventor: HeeSuk Pang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/484,322

(22) Filed: Sep. 24, 2021

(65) Prior Publication Data

US 2022/0013606 A1    Jan. 13, 2022

Related U.S. Application Data

(62) Division of application No. 16/682,933, filed on Nov. 13, 2019, now Pat. No. 11,164,926.

(30) Foreign Application Priority Data

Nov. 19, 2018   (KR) ........................ 10-2018-0142614

(51) Int. Cl.
    *H01L 27/32*      (2006.01)
    *H01L 51/52*      (2006.01)

(52) U.S. Cl.
    CPC ...... *H01L 27/3248* (2013.01); *H01L 27/3246* (2013.01); *H01L 27/3272* (2013.01); *H01L 27/3274* (2013.01); *H01L 27/3276* (2013.01); *H01L 51/5225* (2013.01); *H01L 2251/568* (2013.01)

(58) Field of Classification Search
    CPC ............. H01L 27/3248; H01L 27/3246; H01L 27/3272; H01L 27/3274; H01L 27/3276; H01L 27/3262; H01L 27/3244; H01L 27/124; H01L 27/326; H01L 51/5225; H01L 51/568; H01L 51/5206; H01L 51/56
    See application file for complete search history.

(56) References Cited

U.S. PATENT DOCUMENTS

2007/0108443 A1    5/2007    Kim
2012/0326177 A1    12/2012    Shirouzu
(Continued)

*Primary Examiner* — Kyoung Lee
*Assistant Examiner* — Christina A Sylvia
(74) *Attorney, Agent, or Firm* — Polsinelli PC

(57) ABSTRACT

An organic light emitting display device including a plurality of pixels having a first sub-pixel and a second sub-pixel comprises a base substrate; a first anode disposed on the base substrate in the first sub-pixel; a second anode disposed on the base substrate in the second sub-pixel; an anode connection part connected to the first and second anodes; a driving transistor including a drain electrode that contacts the anode connection part and switching a driving power supplied to the first and second anodes; an organic light emitting layer disposed on the first and second anodes; a cathode disposed on the organic light emitting layer; and a dummy repair part including a plurality of metal layers overlapping each other with an insulating film interposed therebetween in a laser irradiation area, wherein at least one metal layer among the plurality of metal layers contacts the drain electrode and the cathode has an opened shape in the laser irradiation area.

10 Claims, 12 Drawing Sheets

(56) References Cited

U.S. PATENT DOCUMENTS

2014/0346475 A1* 11/2014 Cho .................. H01L 51/56
 438/4
2016/0211314 A1* 7/2016 Kim .................. H01L 27/3248
2017/0062543 A1 3/2017 Hsin

* cited by examiner

ORGANIC LIGHT EMITTING DISPLAY DEVICE AND METHOD FOR REPAIRING ORGANIC LIGHT EMITTING DISPLAY DEVICE

CROSS REFERENCE TO RELATED APPLICATION

This application is a division of application Ser. No. 16/682,933 filed on Nov. 13, 2019, which claims the benefit under 35 USC 119(a) of Korean Patent Application No. 10-2018-0142614 filed on Nov. 19, 2018 in the Korean Intellectual Property Office, the entire disclosures of which are incorporated herein by reference for all purposes.

BACKGROUND

Field of the Disclosure

The present disclosure relates to an organic light emitting display device and a repair method thereof, and more particularly, to an organic light emitting display device having a structure capable of easily performing a repair process, and a method for easily repairing the organic light emitting display device.

Description of the Background

A self-emission type display device comprises a light emitting element disposed in each of a plurality of pixels to emit light, and a driving transistor electrically connected with the light emitting element to switch driving of the light emitting element. For example, an organic electroluminescent display device comprises an organic light emitting diode disposed in each of a plurality of pixels and a driving transistor electrically connected with the organic light emitting diode.

The driving transistor switches the driving of the organic light emitting diode, and the driving transistor comprises a gate electrode, an active pattern, a source electrode, and a drain electrode. The driving transistor is turned on by a gate signal applied to the gate electrode, and when the driving transistor has been turned on, a power signal provided through the source electrode is applied to the organic light emitting diode side through the active pattern and the drain electrode, such that the organic light emitting diode emits light.

Meanwhile, a conductive foreign matter can be in-flowed between the cathode and the anode of the organic light emitting diode in the process of manufacturing the organic light emitting display device. In this case, a short circuit phenomenon can occur between the cathode and the anode due to the conductive foreign matter, and therefore, the driving power provided to the anode side can be leaked and the light emitting function of the organic light emitting diode may not operate.

In the case where one organic light emitting diode is disposed in one pixel, the corresponding pixel can be visually recognized as a dark spot when the light emitting function of the organic light emitting diode does not operate due to the above-described reason. Therefore, when two organic light emitting diodes are disposed in one pixel, and the light emitting function of one of two does not operate, the repair process for the pixel can be carried out so that the other one of the two organic light emitting diodes is operated.

SUMMARY

An aspect of the present disclosure provides an organic light emitting display device designed to facilitate a repair process.

Another aspect of the present disclosure provides a repair method capable of easily repairing the organic light emitting display device.

For achieving the above-described one object of the present disclosure, an organic light emitting display device comprising a plurality of pixels having each divided into a first sub-pixel and a second sub-pixel comprises a base substrate, a first anode, a second anode, an anode connection part, a driving transistor, an organic light emitting layer, a cathode, and a dummy repair part.

The first anode is disposed on the base substrate in correspondence with the first sub-pixel. The second anode is disposed on the base substrate in correspondence with the second sub-pixel. The anode connection part is connected to the first and second anodes.

The driving transistor comprises a drain electrode contacting the anode connection part, thereby switches the driving power provided to the first and second anodes sides. The organic light emitting layer is disposed on the first and second anodes. The cathode is disposed on the organic light emitting layer. The dummy repair part comprises metal layers overlapping each other with an insulating film interposed therebetween in correspondence with a laser irradiation area, and at least one metal layer among the metal layers contacts the drain electrode. The cathode has the opened shape in the laser irradiation area.

For achieving the above-described another object of the present disclosure, a method for repairing an organic light emitting display device comprising a plurality of pixels, and each of the plurality of the pixels are divided into a first sub-pixel in which a first anode has been disposed and a second sub-pixel in which a second anode has been disposed is as follows.

The driving power is provided to the first anode and the second anode through the anode connection part contacting the drain electrode of the driving transistor. The non-light-emission of each of the first sub-pixel and the second sub-pixel is confirmed. A portion for connecting the drain electrode with the first anode in the anode connection part is disconnected. The laser is irradiated to the laser irradiation area of the dummy repair part so that the drain electrode of the driving transistor is connected to the first anode and the second anode again. A portion for connecting the drain electrode with the second anode in the anode connection part is disconnected by the laser.

According to the present disclosure, the cathode has an opened structure in correspondence with the area irradiated by the laser for repairing the organic light emitting display device. Therefore, the phenomenon that the cathode is short-circuited with the metal layers provided to the organic light emitting display panel for the purpose of repair by the irradiated laser can be prevented.

In addition, as described above, in the present disclosure, since the structure for preventing the short circuit of the cathode is implemented in the organic light emitting display panel, a process for rearranging the organic light emitting display panel so that the back surface of the organic light emitting display panel faces upwards in order to prevent the short circuit of the cathode while the repair process of the organic light emitting display panel proceeds is not needed. Therefore, in the present disclosure, since the repair process can proceed in the process of manufacturing the organic light emitting display panel without rearrangement of the organic light emitting display panel, it is possible to shorten the process time required for the repair process.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
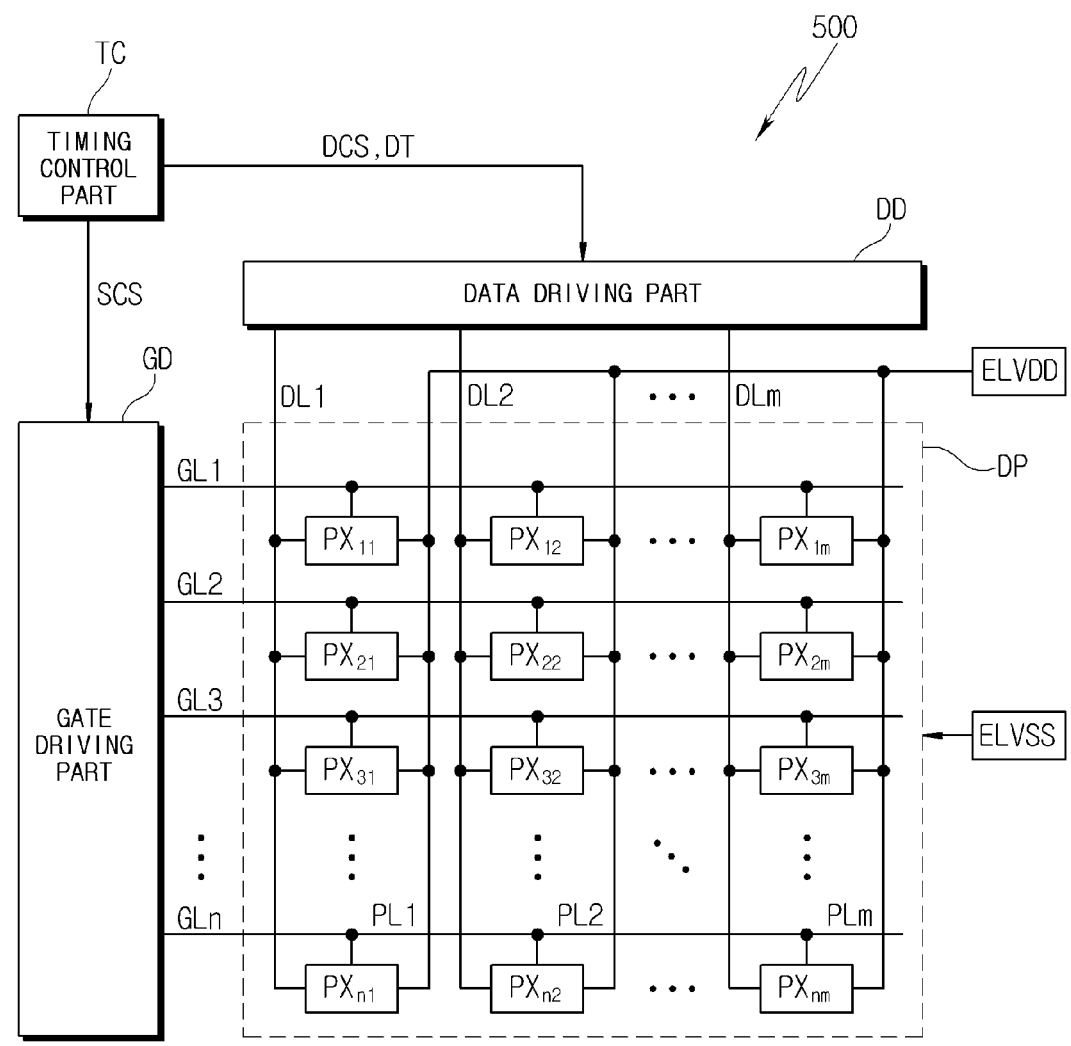
FIG. 1 is a block diagram showing a configuration of an organic light emitting display device according to an aspect of the present disclosure.

Hereinafter, aspects of the present disclosure will be described in detail with reference to the accompanying drawings. The above objects, features and effects of the present disclosure will be able to be understood through the aspects in connection with the drawings. However, the present disclosure is not limited to the aspects described herein, and can also be applied and deformed in various forms. Rather, the aspects of the present disclosure described later are provided to further clarify the technical idea disclosed by the present disclosure, and furthermore, sufficiently convey the technical idea of the present disclosure to those skilled in the art to which the present disclosure pertains. Therefore, the scope of the present disclosure should not be construed as being limited by the aspects described later. Meanwhile, in the following aspects and the drawings, the same reference numerals denote the same elements.

In addition, the terms such as 'first' and 'second' in the present specification are used for the purpose of distinguishing one element from another element, not the limitative meaning. In addition, when a portion of a film, an area, a component, etc. is referred to as being "above" or "on" another portion, it comprises not only the case where the portion is directly on another portion but also the case where another film, area, component, etc. is interposed therebetween.

FIG. 1 is a block diagram showing a configuration of an organic light emitting display device according to an aspect of the present disclosure.

Referring to FIG. 1, an organic light emitting display device 500 comprises an organic light emitting display panel (DP), a timing control part (TC), a gate driving part (GD), and a data driving part (DD).

The timing control part (TC) receives input image signals, and the timing control part (TC) outputs image data (DT), a gate driving control signal (SCS), and a data driving control signal (DCS) converted to match the operating mode of the organic light emitting display panel (DP).

The gate driving part (GD) generate a plurality of gate signals by receiving the gate driving control signal (SCS) from the timing control part (TC), and the generated plurality of gate signals are provided to the organic light emitting display panel (DP) side through gate lines (GL1 to GLn).

The data driving part (DD) receives the data driving control signal (DCS) and the image data (DT) from the timing control part (TC). The data driving part (DD) generates a plurality of data signals based on the received data driving control signal (DCS) and the image data (DT), and the generated plurality of data signals are provided to the organic light emitting display panel (DP) side through data lines (DL1 to DLn).

In the present aspect, each of the gate lines (GL1 to GLn) is extended in the horizontal direction of the organic light emitting display panel (DP), and each of the data lines (DL1 to DLn) is extended in the vertical direction of the organic light emitting display panel (DP). The data lines (DL1 to DLn) are insulated from and intersect with the gate lines (GL1 to GLn).

The organic light emitting display panel (DP) comprises a plurality of pixels (PX11 to PXnm), and the organic light emitting display panel (DP) displays the image by using the light output from the plurality of pixels (PX11 to PXnm). In the present aspect, the plurality of pixels (PX11 to PXnm) can be arranged in a matrix shape in the horizontal direction and the vertical direction of the organic light emitting display panel (DP).

A first power voltage (ELVDD) and a second power voltage (ELVSS) of a level higher than the first power voltage (ELVDD) are provided to the organic light emitting display panel (DP) through power lines (PL1 to PLm) from the outside, and each of the plurality of pixels (PX11 to PXnm) receives the first power voltage (ELVDD) and the second power voltage (ELVSS).

Each of the plurality of pixels (PX11 to PXnm) is electrically connected to a corresponding gate line among the gate lines (GL1 to GLn) and a corresponding data line among the data lines (DL1 to DLn). Therefore, each of the plurality of pixels (PX11 to PXnm) can be turned on by a corresponding gate signal to receive a corresponding data signal, and therefore, each of the plurality of pixels (PX11 to PXnm) can emit the light in response to the data signal.

In the present aspect, each pixel of the plurality of pixels (PX11 to PXnm) can comprise two sub-pixels divided, and two light emitting diodes are disposed to have one-to-one correspondence with the two sub-pixels.

Therefore, when the first power voltage (ELVDD) and the second power voltage (ELVSS) are provided to the pixel side, the two light emitting diodes owned by the pixel can emit the light to output the light from the pixel. In addition, although one light emitting diode of the two light emitting diodes emits the light and the other light emitting diode does not emit the light, the light can be output from the pixel.

Hereinafter, a structure of one pixel among the plurality of pixels (PX11 to PXnm) held by the organic light emitting display panel (DP) will be described as follows.

Figure 2:
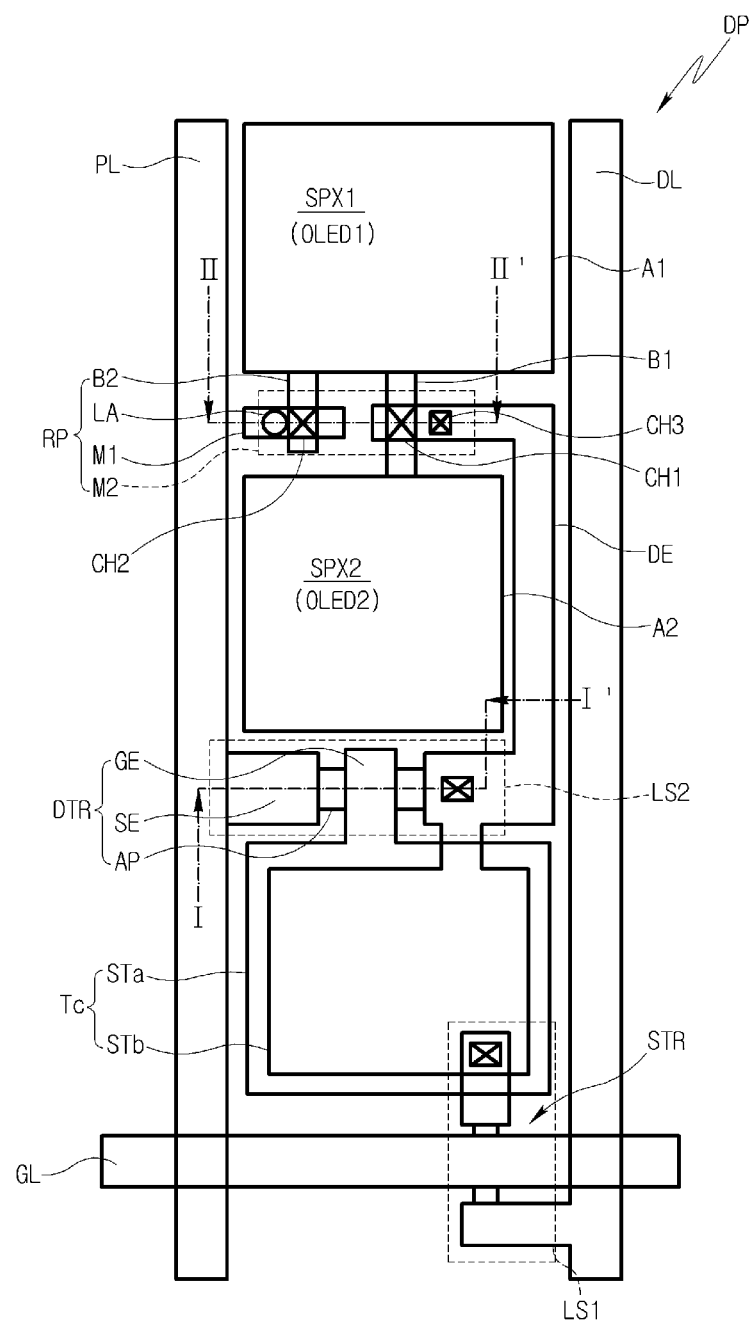
FIG. 2 is a plan view of a structure of one pixel among a plurality of pixels shown in FIG. 1.
Figure 3A:
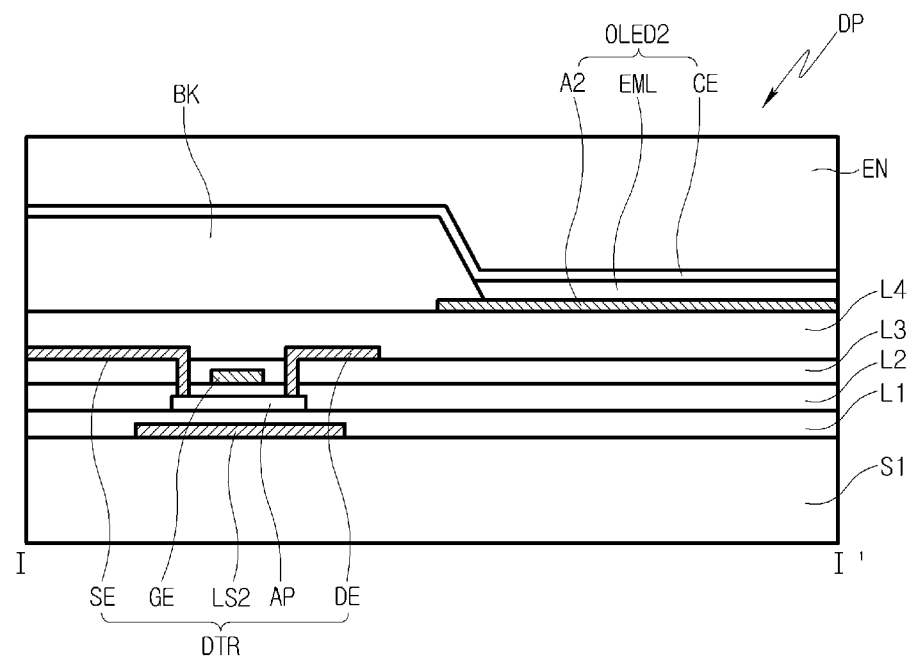
FIG. 3A is a cross-sectional view of the surface taken along line I-I' shown in FIG. 2.
Figure 3B:
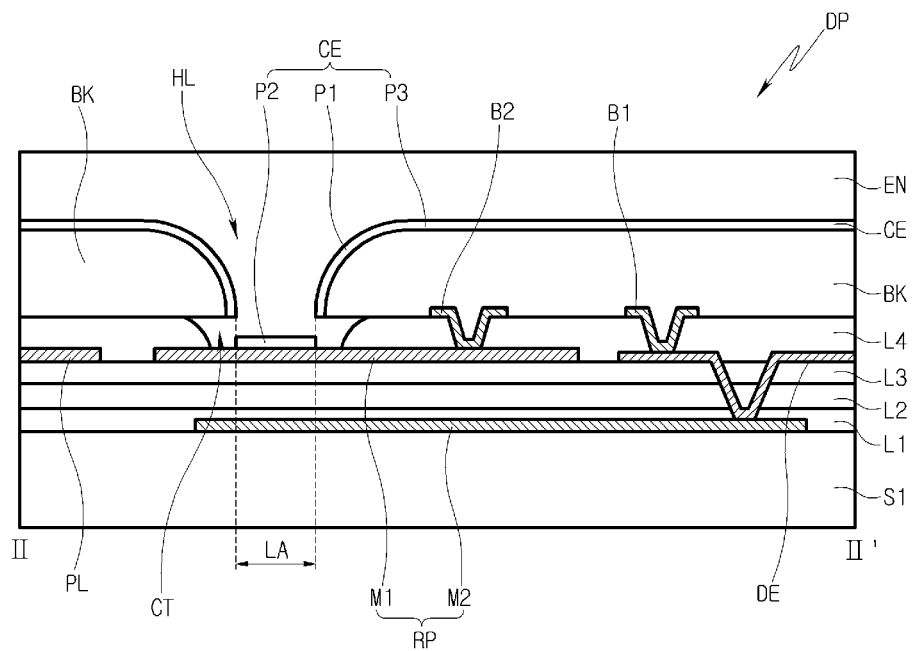
FIG. 3B is a cross-sectional view of the surface taken along the line II-IF shown in FIG. 2.

FIG. 2 is a plane view of a structure of one pixel among the plurality of pixels shown in FIG. 1, FIG. 3A is a cross-sectional view of the surface taken along the line I-I' shown in FIG. 2, and FIG. 3B is a cross-sectional view of the surface taken along the line shown in FIG. 2.

Referring to FIGS. 2, 3A, and 3B, as explained with reference to FIG. 1, the organic light emitting display panel (DP) comprises the plurality of pixels (PXnm in FIG. 1), and each of the plurality of pixels comprises a first sub-pixel (SPX1) and a second sub-pixel (SPX2). That is, each of the plurality of pixels constituting the organic light emitting display panel (DP) has a structure divided into the first sub-pixel (SPX1) and the second sub-pixel (SPX2), and a first organic light emitting diode (OLED1) is disposed in the first sub-pixel (SPX1) and a second organic light emitting diode (OLED2) is disposed in the second sub-pixel (SPX2).

The organic light emitting display panel (DP) comprises a base substrate (S1), a gate line (GL), a data line (DL), a power line (PL), a storage capacitor (Tc), a switching transistor (STR), a driving transistor (DTR), an anode connection part (B1), a first anode (A1), a second anode (A2), an organic light emitting layer (EML), a cathode (CE), an anode branch part (B2), and a dummy repair part (RP). According to the above-described components of the organic light emitting display panel (DP), the first organic light emitting diode (OLED1) can be composed of the first anode (A1), the organic light emitting layer (EML), and the cathode (CE), and the second organic light emitting diode (OLED2) can be composed of the second anode (A2), the organic light emitting diode (EML), and the cathode (CE).

The switching transistor (STR) can comprise a gate electrode connected to the gate line (GL), a source electrode connected to the data line (DL), a drain electrode spaced apart from the source electrode, and an active pattern contacting the source electrode and the drain electrode. The switching transistor (STR) can be turned on by the gate signal provided through the gate line (GL) to output the data signal provided through the data line (DL).

In the present aspect, a first light shield layer (LS1) can be disposed on the base substrate (S1) in correspondence with the area where the switch transistor (STR) has been formed. More specifically, the first light shield layer (LS1) is disposed between the base substrate (S1) and the switching transistor (STR), and the first light shield layer (LS1) is made of a material reflecting the light, such as metal, to block the light proceeding toward the switching transistor (STR) side. Therefore, the switching characteristics of the switching transistor (STR) can be prevented from being changed by the light incident to the active pattern side of the switching transistor (STR) by the first light shield layer (LS1).

The storage capacitor (Tc) comprises a first storage electrode (STa) and a second storage electrode (STb). The first storage electrode (STa) and the second storage electrode (STb) can be disposed on the base substrate (S1) to have a structure overlapping each other with an insulating film interposed therebetween. The storage capacitor (Tc) can charge a charge amount in correspondence with the difference between the voltage in correspondence with the data signal output from the switching transistor (STR) and the power voltage provided from the power line (PL).

The driving transistor (DTR) can comprise a gate electrode (GE), a source electrode (SE), an active pattern (AP), and a drain electrode (DE). The active pattern (AP) is disposed on a first insulating film (L1), and the active pattern (AP) comprises a semiconductor material. In the present aspect, the active pattern (AP) can comprise polycrystalline silicon. However, the present disclosure is not limited to the material of the active pattern (AP). For example, in another aspect, the active pattern (AP) can comprise an oxide semiconductor or a compound semiconductor.

A second insulating film (L2) is disposed on the active pattern (AP), and the gate electrode (GE) is disposed on the second insulating film (L2) to be overlapped with the active pattern (AP). In addition, a third insulating film (L3) is disposed on the gate electrode (GE), and the source electrode (SE) and the drain electrode (DE) are disposed on the third insulating film (L3) while being spaced apart from each other.

In the present aspect, the source electrode (SE) has a shape branched from the power line (PL), and the source electrode (SE) contacts the active pattern (AP). In addition, the drain electrode (DE) is spaced apart from the source electrode (SE) to contact the active pattern (AP).

In the present aspect, the drain electrode (DE) contacts the anode connection part (B1) through a first contact hole (CH1). Therefore, when the driving transistor (DTR) is turned on, the power signal of the power line (PL) can be provided to the anode connection part (B1) through the drain electrode (DE). In addition, the power signal provided to the anode connection part (B1) can be provided to the first and second anodes A1, A2 sides connected to the anode connection part (B1).

The first organic light emitting diode (OLED1) can emit the light by the power signal provided to the first anode (A1) through the anode connection part (B1) to output the light from the first sub-pixel (SPX1). In addition, the second organic light emitting diode (OLED2) can emit the light by the power signal provided to the second anode (A2) through the anode connection part (B1) to output the light from the second sub-pixel (SPX2).

An inter-layer insulating film (L4) is disposed on the driving transistor (DTR) to cover the driving transistor (DTR), and a second light shield layer (LS2) is formed on the base substrate (S1) in correspondence with the area where the driving transistor (STR) has been formed. The second light shield layer (LS2) is disposed between the base substrate (S1) and the driving transistor (DTR), and the second light shield layer (LS2) is made of a material reflecting the light, such as metal, to block the light proceeding toward the driving transistor (DTR) side. Therefore, the switching characteristics of the driving transistor (DTR) can be prevented from being changed by the light incident to the active pattern (AP) side of the driving transistor (DTR) by the second light shield layer (LS2).

A bank layer (BK) is disposed on the inter-layer insulating film (L4). As shown in FIG. 3A, an area where the bank layer (BK) is partially opened and the organic light emitting layer (EML) contacts the second anode (A2) can be defined.

The cathode (CE) contacts the organic light emitting layer (EML) by being formed on the bank layer (BK). In the present aspect, the cathode (CE) can be formed on the bank layer (BK) by the front surface deposition method. Therefore, in the opened portion of the bank layer (BK), the cathode (CE) can be formed on the organic light emitting layer (EML), and in the non-opened portion of the bank layer (BK), the cathode (CE) can be formed on the bank layer (BK). According to the above-described configuration, the second organic light emitting diode (OLED2) can be implemented by the stacked structure of the second anode (A2), the organic light emitting layer (EML), and the cathode (CE) in the second sub-pixel (SPX2). In addition, although not shown separately, the first organic light emitting diode (OLED1) can be implemented by the stacked structure of the first anode (A1), the organic light emitting layer (EML), and the cathode (CE) in the first sub-pixel (SPX1).

The anode connection part (B1) connects the first anode (A1) to the second anode (A2). In addition, the anode connection part (B1) is positioned between the first anode (A1) and the second anode (A2), the first anode (A1) is positioned at one side of the anode connection part (B1), and the second anode (A2) is positioned at the other side of the anode connection part (B1).

In addition, the anode connection part (B1) contacts the drain electrode (DE) of the driving transistor (DTR) through the first contact hole (CH1). Therefore, when the driving transistor (DTR) is turned on, the driving power of the power line (PL) can be provided to the first anode (A1) and the second anode (A2) sides through the drain electrode (DE) of the driving transistor (DTR) and the anode connection part (B1).

In the present aspect, the anode branch part (B2) can have the shape branched from the first anode (A1). The anode branch part (B2) can contact the dummy repair part (RP) through a second contact hole (CH2). When the laser is irradiated to the laser irradiation area (LA) of the dummy repair part (RP) and the metal layers of the dummy repair part (RP) contact each other by the laser, the power signal provided through the drain electrode (DE) of the driving transistor (DTR) can be provided to the first and second anodes (A1, A2) sides through the anode branch part (B2).

The dummy repair part (RP) can be prepared for the purpose of repairing the first and second organic light emitting diodes (OLED1, OLED2) in preparation for the defect occurred in the first and second organic light emitting diodes (OLED1, OLED2) in the process of manufacturing the organic light emitting display panel (DP).

In the present aspect, the dummy repair part (RP) can comprise a first metal layer (M1) and a second metal layer (M2).

The first metal layer (M1) is disposed on the base substrate (S1) and thereby disposed between the inter-layer insulating film (L4) and the third insulating film (L3). In addition, the first metal layer (M1) is spaced apart from the drain electrode (DE) of the driving transistor (DTR), and the first metal layer (M1) contacts the anode branch part (B2) through the second contact hole (CH2).

In the present aspect, the first metal layer (M1) can be formed in the same photography process as the drain electrode (DE) of the driving transistor (DTR). Therefore, when the drain electrode (DE) of the driving transistor (DTR) is formed of the source/drain metal layer, the first metal layer (M1) can be formed of the source/drain metal layer.

The second metal layer (M2) is disposed on the base substrate (S1) and thereby disposed between the base substrate (S1) and the first insulating film (L1). The second metal layer (M2) is disposed below the first metal layer (M1), and the first insulating film (L1), the second insulating film (L2), and the third insulating film (L3) are sequentially stacked between the first metal layer (M1) and the second metal layer (M2).

The second metal layer (M2) overlaps the first metal layer (M1) in the laser irradiation area (LA). Therefore, when the laser irradiation process in which the laser is irradiated to the laser irradiation area (LA) is performed, the first to third insulating films (L1, L2, L3) in correspondence with the laser irradiation area (LA) are burned out by the laser, and a portion of each of the first metal layer (M1) and the second metal layer (M2) in correspondence with the laser irradiation area (LA) is melt by the laser and then sintered.

As a result, after the laser irradiation process has been completed, the first metal layer (M1) and the second metal layer (M2) contact each other, and the dummy repair part (RP) can contact the anode branch part (B2) as well as the drain electrode (DE). Therefore, although the anode connection part (B1) is disconnected while the repair process proceeds, the driving power provided through the drain electrode (DE) can be provided to the first anode (A1) and the second anode (A2) sides through the dummy repair part (RP) and the anode branch part (B2).

In the present aspect, the cathode (CE) in correspondence with the laser irradiation area (LA) of the dummy repair part (RP) has the partially opened shape. More specifically, a through hole (HL) is formed in the bank layer (BK) in correspondence with the laser irradiation area (LA), an undercut (CT) is formed on the inter-layer insulating film (L4) in correspondence with the through hole (HL), and as a result, the cathode (CE) can have the partially opened shape in the laser irradiation area (LA) by the structure of the undercut (CT) implemented in the interlayer insulating film (L4).

In the present aspect, after the through hole (HL) has been formed in the bank layer (BK) corresponding to the laser irradiation area (LA), the undercut (CT) can be formed by using the wet etch process that uses etching solution having a higher etch rate than the bank layer (BK) with respect to the interlayer insulating film (L4). In this case, the bank layer (BK) and the interlayer insulating film (L4) are discontinuously formed by the structure of the undercut (CT) formed by in correspondence with the laser irradiation area (LA), and as a result, the cathode (CE) formed on the bank layer (BK) can be discontinuously formed.

More specifically, a first portion (P1) of the cathode (CE) formed on the side surface of the bank layer (BK) in the laser irradiation area (LA) is connected to a third portion (P3) formed on the upper surface of the bank layer (BK), but the first portion (P1) of the cathode (CE) is not extended to the side surface side of the interlayer insulating film (L4) by the undercut (CT). Therefore, a second portion (P2) of the cathode (CE) can be separated from the first portion (P1) to be formed on the first metal layer (M1), and the cathode (CE) can have the opened shape in the laser irradiation area (LA) by the discontinuous shape between the first portion (P1) and the second portion (P2) of the cathode (CE) described above.

As described above, in the present aspect, the undercut (CT) can be formed on the interlayer insulating film (L4) by a combination of the interlayer insulating film (L4) and the bank layer (BK), but in another aspect, the undercut (CT) can also be formed on the interlayer insulating film (L4) by a combination of layers other than the interlayer insulating film (L4) and the bank layer (BK). For example, in a state where the through hole (HL) has been formed in the bank layer (BK) in correspondence with the laser irradiation area (LA), the anode metal layer containing the same material as those of the first anode (A1) and the second anode (A2) can be stacked on the interlayer insulating film (L4), and the undercut (CT) can also be formed on the interlayer insulating film (L4) by using the wet etch process that uses a higher etch rate than the anode metal layer with respect to the interlayer insulating film (L4).

In another aspect, in a state where the through hole (HL) has been formed in the bank layer (BK) in correspondence with the laser irradiation area (LA), another insulating film other than the bank layer (BK) can be stacked on the interlayer insulating film (L4), and the undercut (CT) can be formed on the interlayer insulating film (L4) by using the wet etch process. In this case, considering that the interlayer insulating film (L4) is made of silicon oxide, a material of the insulating film stacked on the interlayer insulating film (L4) can be an insulating material having a lower etch rate than silicon oxide with respect to any etching solution. Meanwhile, as described above, when the cathode (CE) has the opened shape in the laser irradiation area (LA), the cathode (CE) can be prevented from being connected to the first metal layer (M1) and the second metal layer (M2), in the process that the first metal layer (M1) is connected to the second metal layer (M2) by the laser irradiation process described above.

More specifically, in the laser irradiation process, since the second portion (P2) of the cathode (CE) is positioned above the first metal layer (M1), the second portion (P2) can be connected with the first and second metal layers (M1, M2). However, as described above, since the second portion (P2) of the cathode (CE) is separated from the first portion (P1) and the third portion (P3) of the cathode (CE) by the undercut (CT), the first and second metal layers (M1, M2) are not connected to the first portion (P1) and the third portion (P3) of the cathode (CE) after the laser irradiation process has been completed.

That is, as in an aspect of the present disclosure, when the cathode (CE) has the partially opened shape in correspondence with the laser irradiation area (LA), the first and second metal layers (M1, M2) can be prevented from being connected to another portion of the cathode (CE) positioned at the peripheral of the laser irradiation area (LA) after the laser irradiation process has been completed.

In addition, a direction in which the laser proceeds toward the base substrate (S1) from the bank layer (BK) is defined as a first direction, and a direction in which the laser proceeds toward the bank layer (BK) from the base substrate (S1) is defined as a second direction. In this case, unlike an aspect of the present disclosure, when the cathode (CE) does not have the opened structure in correspondence with the laser irradiation area (LA), the cathode (CE) is positioned on the proceeding path of the laser if the laser is irradiated in the first direction, such that the cathode (CE) as well as the first and second metal layers (M1, M2) of the dummy repair part (RP) are melted by the laser, and as a result, the first metal layer (M1), the second metal layer (M2), and the cathode (CE) can be connected to each other, thereby occurring the short-circuit phenomenon between two electrodes of each of the first and second organic light emitting diodes (OLED1, OLED2).

Conversely, as in an aspect of the present disclosure, when the cathode (CE) has the opened structure in correspondence with the laser irradiation area (LA), a portion of the cathode (CE) separated from the peripheral thereof like the second portion (P2) can be positioned on the proceeding path of the laser in the first direction even if the laser is irradiated in the first direction, occurrence of the short-circuit phenomenon between two electrodes of each of the first and second organic light emitting diodes (OLED1, OLED2) may be prevented, after the laser irradiation process has been completed.

Meanwhile, when the laser is irradiated in the second direction, the cathode (CE) is not positioned on the path of the laser proceeding in the second direction, thereby the phenomenon of which the cathode (CE) is short-circuited with the first and second metal layers (M1, M2) after the laser irradiation process has been completed does not occur. However, since the repair process comprising the laser irradiation process proceeds in the process of manufacturing the organic light emitting display panel (DP), the rearrangement process of the organic light emitting display panel (DP) can be needed so that the back surface of the organic light emitting display panel (DP) faces upwards in order to radiate the laser in the second direction, and the rearrangement process of the organic light emitting display panel (DP) can function as a factor of increasing the process time required for the repair process of the organic light emitting display panel (DP).

Therefore, in an aspect of the present disclosure, by selecting the direction of which the laser is irradiated in the laser process as the first direction, the rearrangement process of the organic light emitting display panel (DP) can be excluded while the repair process proceeds. In addition, although the laser is irradiated in the first direction at the same time, the cathode (CE) is formed in the discontinuous shape in the laser irradiation area (LA) and the peripheral area thereof to form the opening in the cathode (CE) in the laser irradiation area (LA), thereby the short-circuit phenomenon between the electrodes of the organic light emitting diode of the organic light emitting display panel (DP) can easily be prevented.

An encapsulation film (EN) is disposed on the cathode (CE), and the encapsulation film (EN) covers the first and second organic light emitting diodes (OLED1, OLED2) and thereby blocks moisture or gas flowing into the first and second organic light emitting diodes (OLED1, OLED2) sides. In the present aspect, an encapsulation film 90 can be an organic film, an inorganic film, or a metal film, and the encapsulation film 90 can be a multi-layer structure which is formed by stacking at least one of the organic film, the inorganic film, and the metal film.

In the present aspect, the above-described repair process performed by irradiating the laser to the dummy repair part (RP) can be performed before forming the encapsulation film (EN) on the cathode (CE), and after the repair process has been completed, the encapsulation film (EN) can be formed on the cathode (CE).

Figure 4:
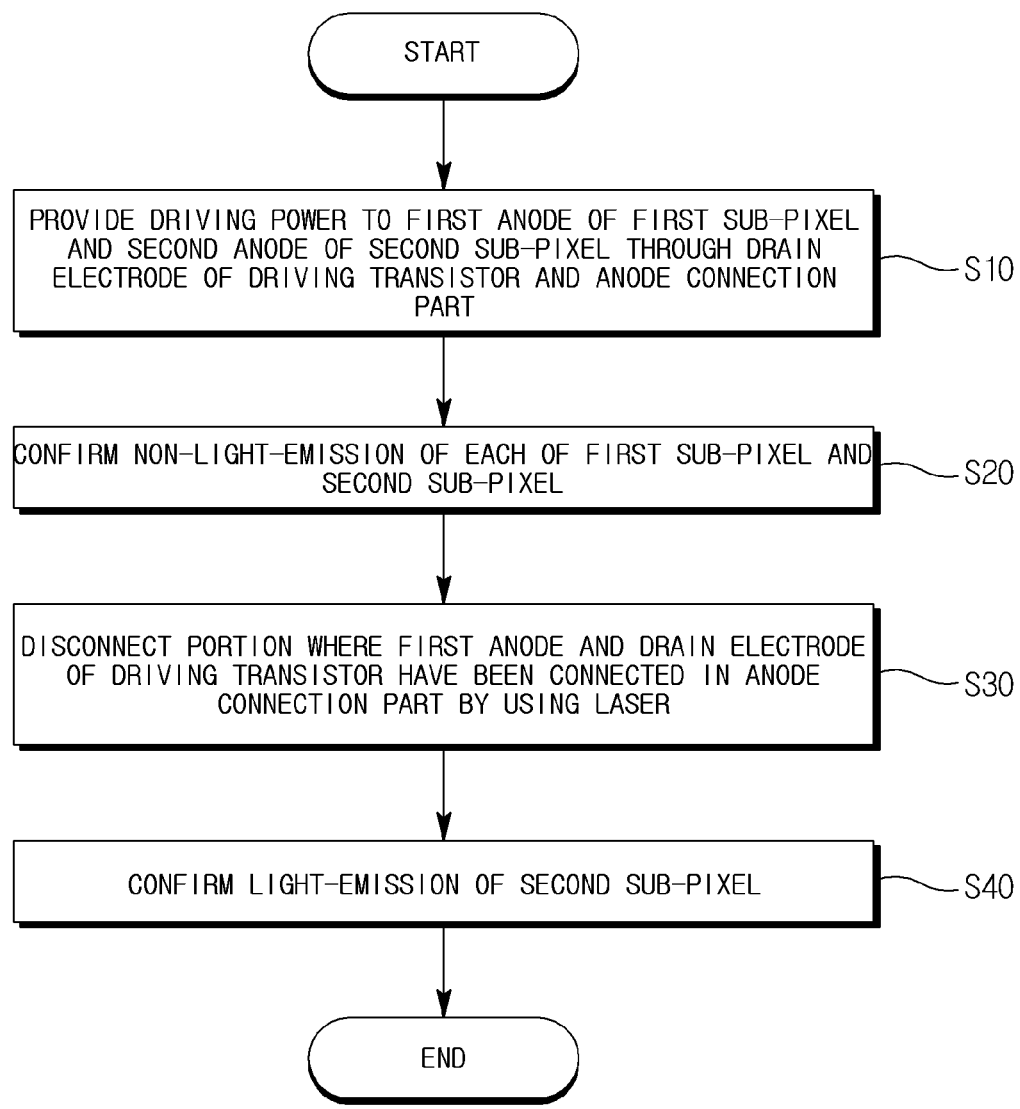
FIG. 4 is a flowchart showing a method for repairing the organic light emitting display device having the pixel structure shown in FIGS. 2, 3A, and 3B according to an aspect of the present disclosure.
Figure 5:
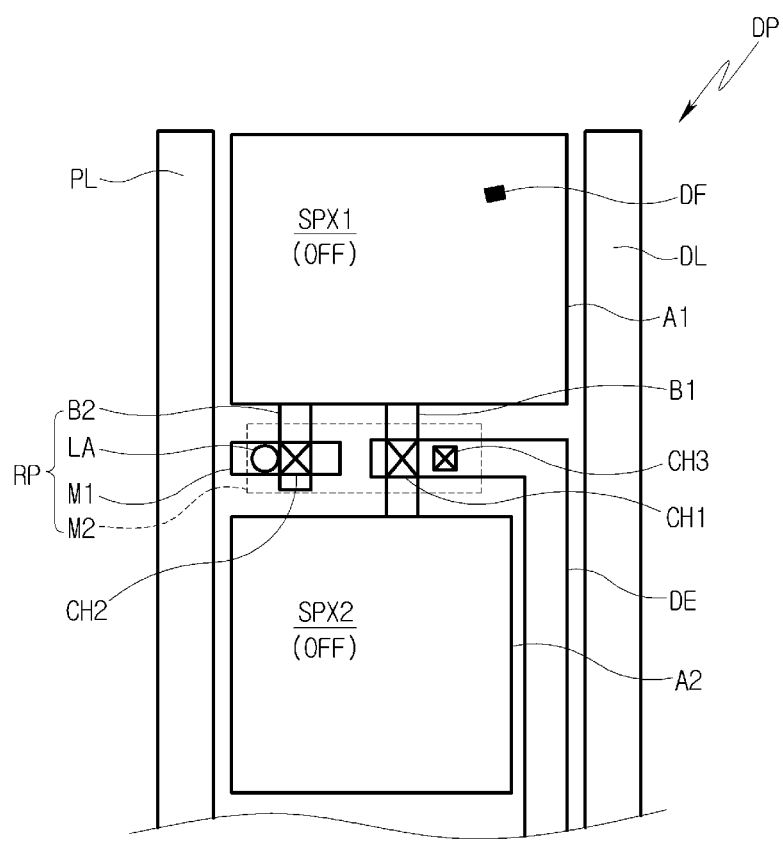
FIGS. 5 to 7 illustrate processes for repairing the pixel of the organic light emitting display device according to the flowchart shown in FIG. 4.
Figure 6:
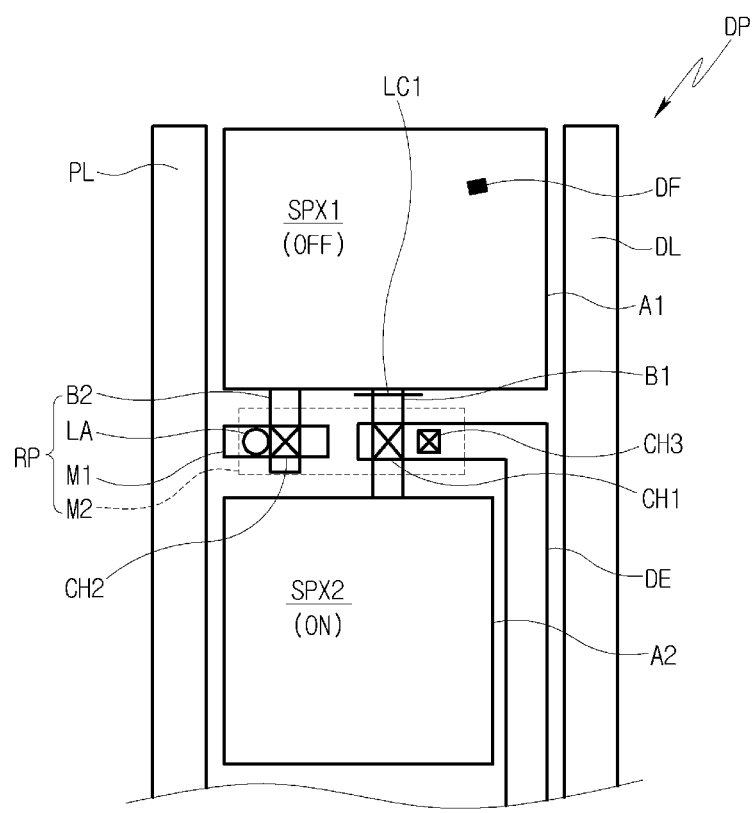
Figure 7:
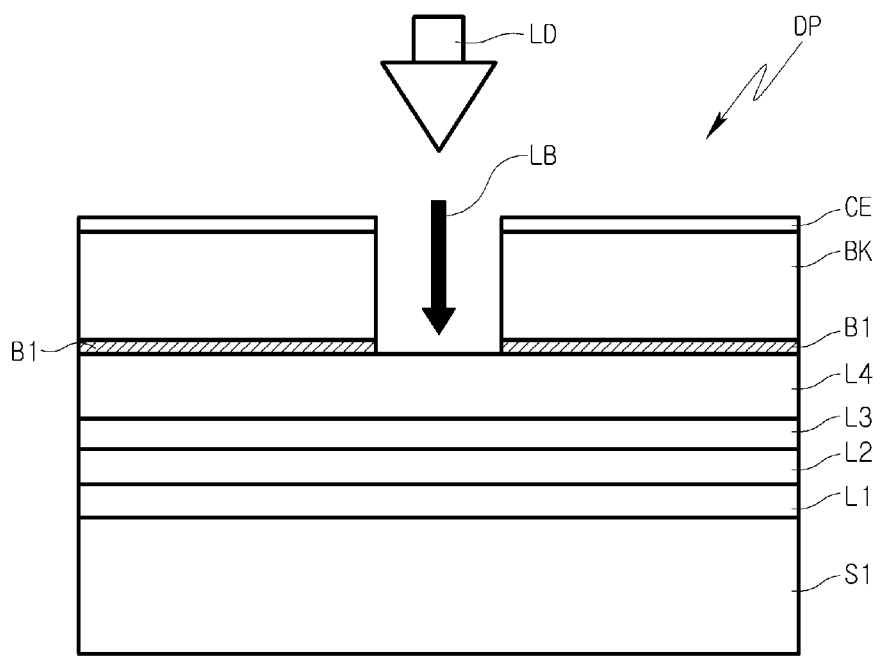

FIG. 4 is a flowchart showing a method for repairing the organic light emitting display device having the pixel structure shown in FIGS. 2, 3A, and 3B according to an aspect of the present disclosure, and FIGS. 5 to 7 are diagrams showing processes for repairing the pixel of the organic light emitting display device according to the flowchart shown in FIG. 4.

Referring to FIGS. 4 and 5, the driving power is provided to the first anode (A1) of the first sub-pixel (SPX1) and the second anode (A2) of the second sub-pixel (SPX2) through the drain electrode (DE) of the driving transistor (DTR in FIG. 2) and the anode connection part (B1) S10.

An aspect shown in FIG. 5 is a case where the conductive foreign matter (DF) has been in-flowed between the first anode (A1) of the first sub-pixel (SPX1) and the cathode (CE in FIG. 3A), and the short-circuit phenomenon occurs between the first anode (A1) and the cathode (CE) by the conductive foreign matter (DF). Therefore, the driving power provided to the first and second anodes (A1, A2) sides is leaked through a point short-circuited between the first anode (A1) and the cathode (CE), such that the non-light-emission states of the first organic light emitting diode disposed in the first sub-pixel (SPX1) and the second organic light emitting diode disposed in the second sub-pixel (SPX2) are confirmed S20.

Meanwhile, as described above, although the non-light-emission states of the first sub-pixel (SPX1) and the second sub-pixel (SPX2) are confirmed, the position of the conductive foreign matter (DF) may not be confirmed, therefore, whether any pixel of the first and second sub-pixels (SPX1, SPX2) is abnormal may not be easy.

Referring to FIGS. 4, 6, and 7, the portion where the first anode (A1) and the drain electrode (DE) of the driving transistor have been connected in the anode connection part (B1) is disconnected by the laser S30. More specifically, a laser irradiation device (LD) is disposed above the organic light emitting display panel (DP), the laser irradiation device (LD) is operated to irradiate the laser (LB) to the anode connection part (B1), and at the same time, the laser irradiation device (LD) is moved in the horizontal direction.

As a result, as shown in FIG. 7, as the portion where the laser (LB) has been irradiated in the anode connection part (B1) is burned-out, the anode connection part (B1) is partially removed. Therefore, when viewing on the plain, a first laser cut-out part (LC1) defined by partially removing the anode connection part (B1) is formed on the connected portion of the first anode (A1) and the drain electrode (DE) in the anode connection part (B1).

Meanwhile, as the first laser cut-out part (LC1) is formed in the anode connection part (B1), the driving power passing through the drain electrode (DE) and the anode connection part (B1) is not provided to the first anode (A1) side, and the driving power can be provided to the second anode (A2). As a result, the light is not output from the first sub-pixel (SPX1), but the light-emission of the second sub-pixel (SPX2) is confirmed S40, such that the repair process for the pixel having the first and second sub-pixels (SPX1, SPX2) can be terminated.

Figure 8:
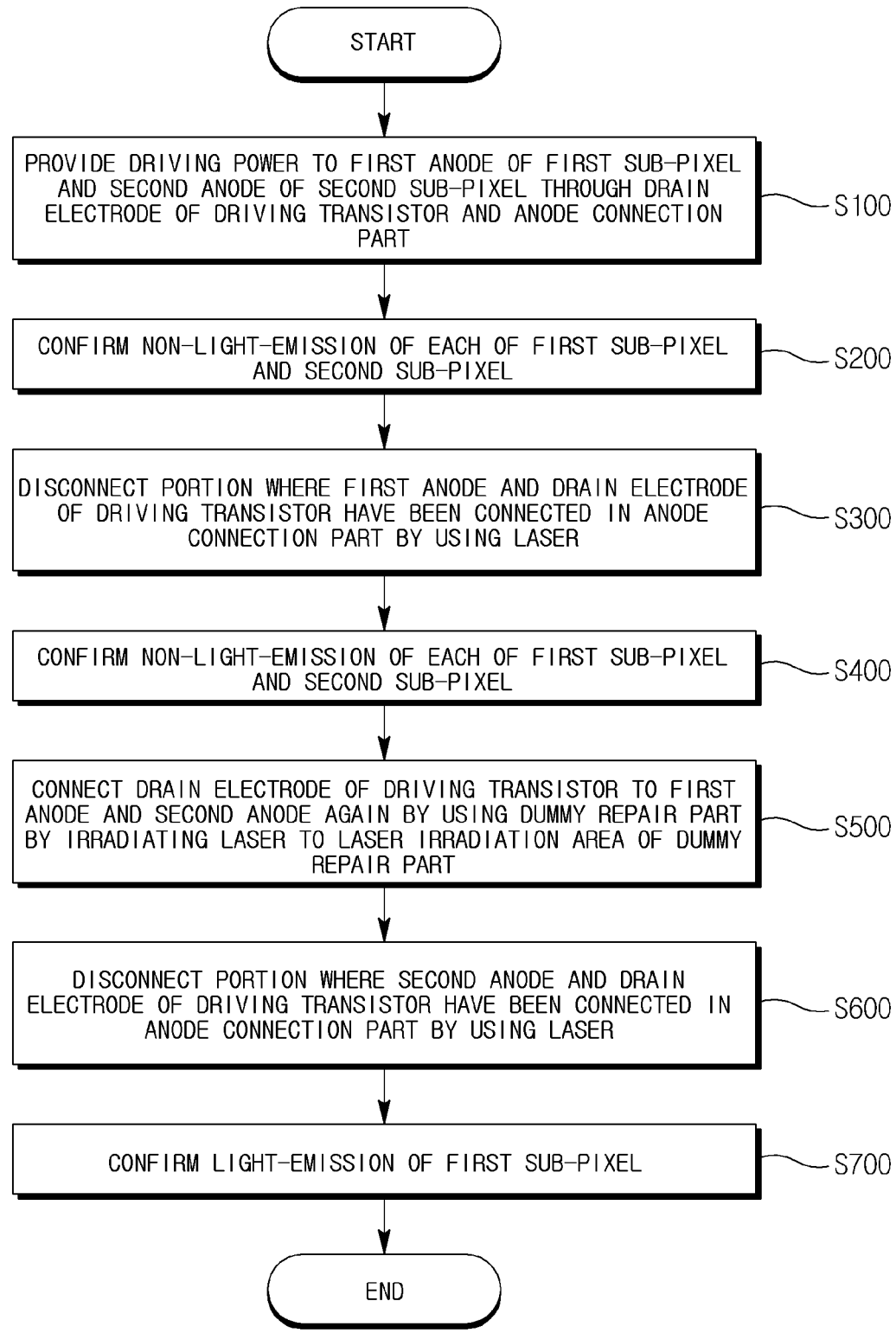
FIG. 8 is a flowchart showing a method for repairing the organic light emitting display device having the pixel structure shown in FIGS. 2, 3A, and 3B according to another aspect of the present disclosure.

FIG. 8 is a flowchart showing a method for repairing the organic light emitting display device having the pixel structure shown in FIGS. 2, 3A, and 3B according to another aspect of the present disclosure, and FIGS. 9 to 12 are figures showing processes for repairing the pixel of the organic light emitting display device according to the flowchart shown in FIG. 8.

Figure 9:
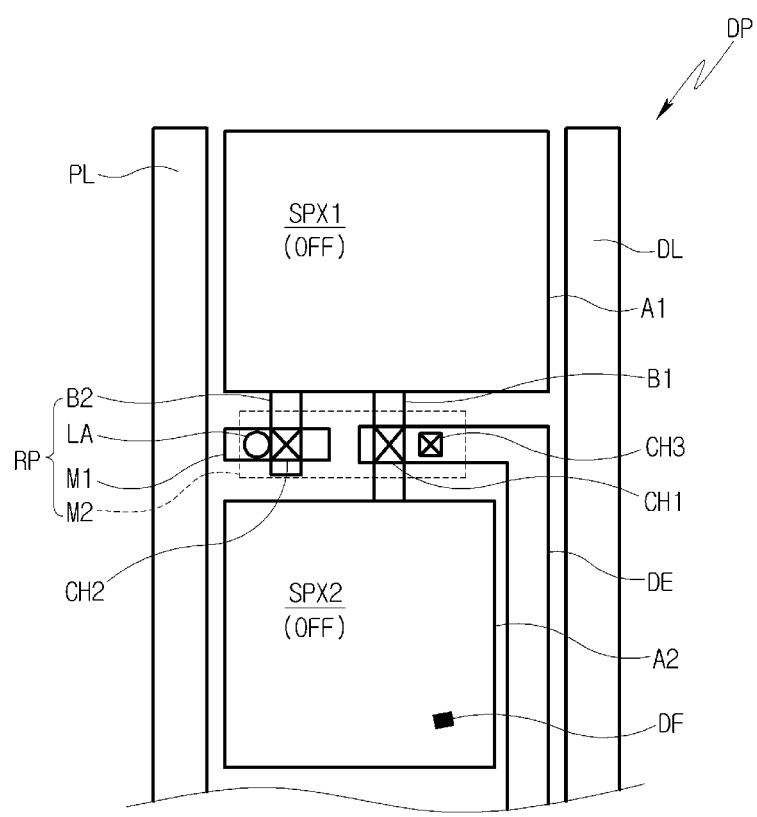
FIGS. 9 to 12 illustrate processes for repairing the pixel of the organic light emitting display device according to the flowchart shown in FIG. 8.

Referring to FIGS. 8 and 9, the driving power is provided to the first anode (A1) of the first sub-pixel (SPX1) and the second anode (A2) of the second sub-pixel (SPX2) through the drain electrode (DE) of the driving transistor (DTR in FIG. 2) and the anode connection part (B1) S100.

An aspect shown in FIG. 9 is a case where the conductive foreign matter (DF) has been in-flowed between the second anode (A2) of the second sub-pixel (SPX2) and the cathode (CE in FIG. 3A), and the short-circuit phenomenon occurs between the second anode (A2) and the cathode (CE) by the conductive foreign matter (DF). Therefore, the driving power provided to the first and second anodes (A1, A2) sides is leaked through a point short-circuited between the second anode (A2) and the cathode (CE), such that the non-light-emission states of the first organic light emitting diode disposed in the first sub-pixel (SPX1) and the second organic light emitting diode disposed in the second sub-pixel (SPX2) are confirmed S200.

Figure 10:
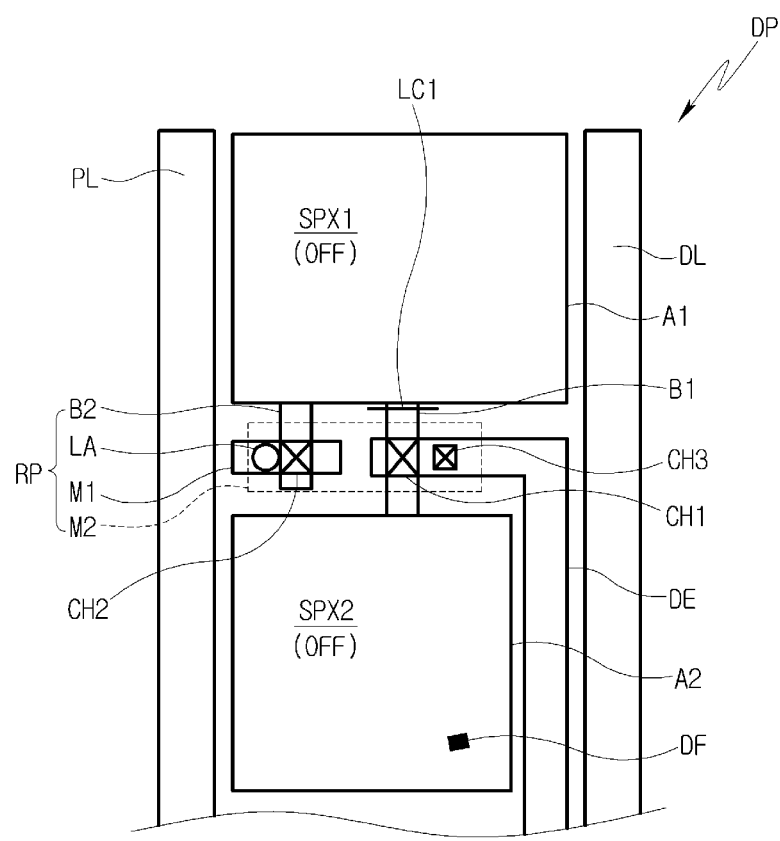
Figure 11:
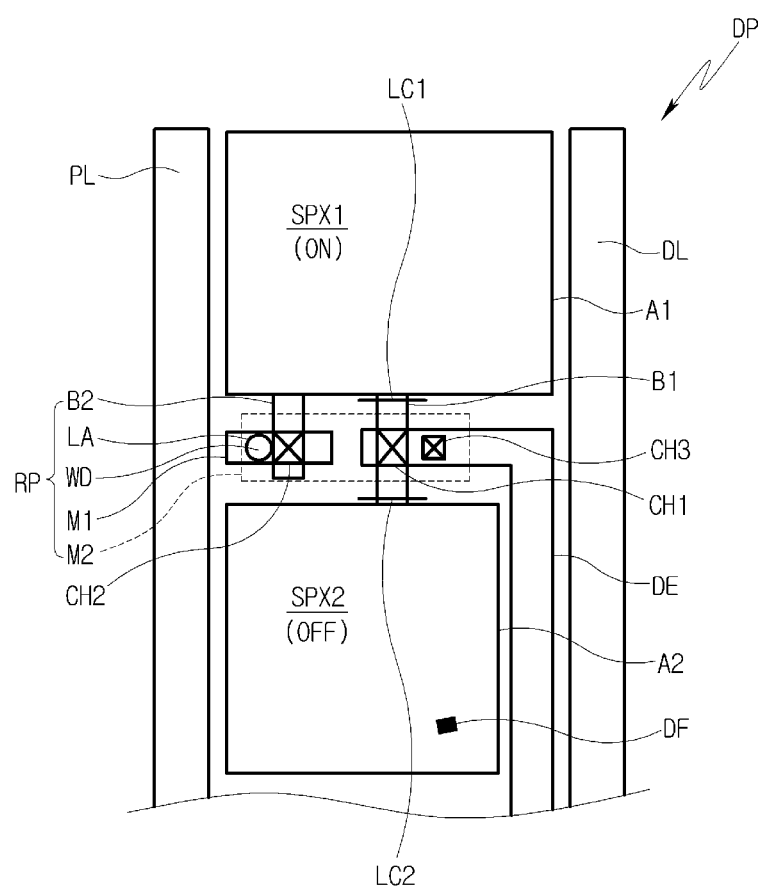

Referring to FIGS. 8, 10, and 11, firstly as described above with reference to the FIGS. 6 and 7, the first laser cut-out part (LC1) is formed in the anode connection part (B1) by using the laser to disconnect the portion where the first anode (A1) and the drain electrode (DE) of the driving transistor have connected in the anode connection part (B1) by using the laser S300.

Meanwhile, in an aspect explained with reference to FIG. 6, since the conductive foreign matter (DF in FIG. 6) is positioned in the first sub-pixel (SPX1), the second sub-pixel (SPX2) can be light-emitted as the first laser cut-out part (LC1) is formed in the anode connection part (B1). However, in an aspect shown in FIG. 10, since the conductive foreign matter (DF) is positioned in the second sub-pixel (SPX2), the driving power provided to the second anode (A2) side through the drain electrode (DE) is leaked through the conductive foreign matter (DF) flowing into the second sub-pixel (SPX2). Therefore, in the present aspect, the first laser cut-out part (LC1) has been formed in the anode connection part (B1) and then each of the first sub-pixel (SPX1) and the second sub-pixel (SPX2) becomes the non-light-emission state S400.

Figure 12:
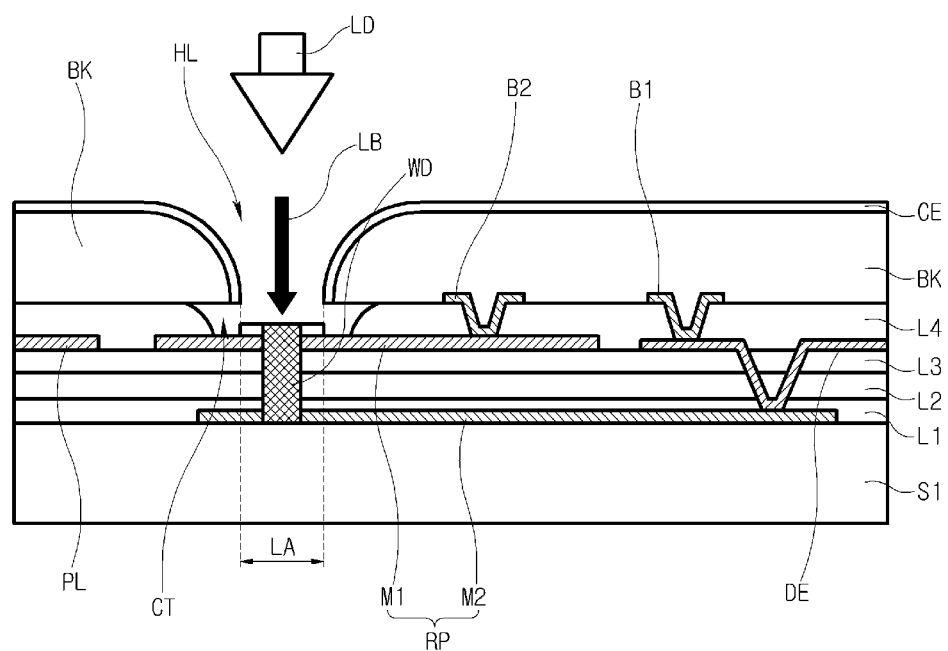

Referring to FIGS. 8, 11, and 12, the laser (LB) is irradiated to the laser irradiation area (LA) of the dummy repair part (RP). As a result, the drain electrode (DE) of the driving transistor is connected to the first anode (A1) and the second anode (A2) again by using the dummy repair part (RP) S500.

More specifically, after the laser irradiation device (LD) has been disposed above the organic light emitting display panel, the laser (LB) is irradiated to the laser irradiation area (LA) of the dummy repair part (RP) by operating the laser irradiation device (LD). As a result, the first to third insulating films (L1, L2, L3) in correspondence with the laser irradiation area (LA) are burned-out by the laser, and a welding part (WD) is formed by in correspondence with the laser irradiation area (LA). The welding part (WD) can be formed by melting a portion of each of the first metal layer (M1) and the second metal layer (M2) overlapping each other with the first to third insulating films (L1, L2, L3) interposed therebetween by the laser and then sintering it.

As a result, after the laser irradiation process has been completed, the first metal layer (M1) contacts the second metal layer (M2) by the welding part (WD), such that the dummy repair part (RP) can be electrically connected to the anode branch part (B2) through the first metal layer (M1). Therefore, although the first anode (A1) and the anode connection part (B1) are disconnected by forming the first laser cut-out part (LC1) before the laser irradiation process, the drain electrode (DE) is electrically connected to the first and second anodes (A1, A2) by the welding part (WD) by irradiating the laser (LB) to the laser irradiation area (LA). Therefore, the driving power can be provided to the first and second anodes (A1, A2) through the drain electrode (DE).

Thereafter, the portion where the second anode (A2) and the drain electrode (DE) of the driving transistor have been connected in the anode connection part (B1) is disconnected by the laser S600. As a result, when viewing on the plain, a second laser cut-out part (LC2) defined by partially removing the anode connection part (B1) is formed in the portion where the second anode (A2) and the drain electrode (DE) have been connected in the anode connection part (B1). In the present aspect, a method for forming the second laser cut-out part (LC2) can be the same as the method for forming the first laser cut-out part (LC1) described above.

As a result, the electrical connection between the drain electrode (DE) and the second anode (A2) is disconnected by the second laser cut-out part (LC2). Therefore, the driving power provided from the power line (PL) is provided to the drain electrode (DE) of the driving transistor and the first anode (A1) side through the welding part (WD) of the dummy repair part (RP). Conversely, since the driving power is not provided to the second anode (A2) side by the second laser cut-out part (LC2), the driving power is not leaked through the conductive foreign matter (DF) flowing into the second sub-pixel (SPX2). As a result, the repair process for the pixel having the first and second sub-pixels (SPX1, SPX2) may be terminated after the light-emission of the first sub-pixel (SPX1) is confirmed.

Although the present disclosure has been described with reference to the above aspects, a person of ordinary skill in the art can understood that various modifications and changes of the present disclosure can be made to the extent of the technical idea and range of the present disclosure recited in the scope of the following claims.

What is claimed is:

1. A method for repairing an organic light emitting display device including a plurality of pixels having a first sub-pixel in which a first anode is disposed and a second sub-pixel in which a second anode is disposed, the method comprising:
providing a driving power to a first anode and a second anode through an anode connection part contacting a drain electrode of a driving transistor;
confirming a non-light-emission of each of the first sub-pixel and the second sub-pixel;
disconnecting a portion for connecting the drain electrode with the first anode in the anode connection part;
reconnecting the drain electrode of the driving transistor to the first anode and the second anode again by irradiating laser to a laser irradiation area of a dummy repair part; and
disconnecting a portion for connecting the drain electrode with the second anode in the anode connection part by the laser.

2. The method of claim 1, wherein the organic light emitting display device includes an organic light emitting layer disposed on the first and second anodes.

3. The method of claim 2, wherein the organic light emitting display device further includes a cathode disposed on the organic light emitting layer, and
wherein the cathode has an opened structure in the laser irradiation area.

4. The method of claim 1, wherein the dummy repair part is disposed on the base substrate, and the laser is irradiated in a direction toward the base substrate from the dummy repair part in the irradiating the laser to the laser irradiation area of the dummy repair part.

5. The method of claim 3, wherein the organic light emitting display device further includes an interlayer insulating film disposed on the dummy repair part, and a bank layer disposed on the interlayer insulating film and having a through hole in the laser irradiation area.

6. The method of claim 5, wherein the interlayer insulating film has an in correspondence with the through hole to cathode is formed to be opened.

7. The method of claim 3, wherein the cathode is formed to have a discontinuous shape in the laser irradiation area.

8. The method of claim 1, wherein, in the irradiating the laser to the laser irradiation area of the dummy repair part, a plurality of metal layers of the dummy repair part overlapping each other with an insulating film interposed therebetween in the laser irradiation area is connected to each other.

9. The method of claim 1, wherein the first anode includes an anode branch part contacting the dummy repair part.

10. The method of claim 9, wherein the dummy repair part is formed of a first metal layer disposed on the base substrate and a second metal layer disposed below the first metal layer,
wherein the first metal layer contacts the anode branch part by being spaced apart from the drain electrode, the second metal layer overlaps the first metal layer with the insulating film interposed therebetween in the laser irradiation area, and
wherein the first metal layer and the second metal layer are connected to each other by the laser irradiated to the laser irradiation area.

* * * * *